US012602605B2

(12) United States Patent
Kim et al.

(10) Patent No.: US 12,602,605 B2
(45) Date of Patent: Apr. 14, 2026

(54) QUANTUM COMPUTER ARCHITECTURE BASED ON MULTI-QUBIT GATES

(71) Applicants: IonQ, Inc., College Park, MD (US);
University of Maryland, College Park,
College Park, MD (US); **Duke
University**, Durham, NC (US)

(72) Inventors: Jungsang Kim, Chapel Hill, NC (US);
Yunseong Nam, North Bethesda, MD
(US); Christopher Monroe, Ellicott
City, MD (US)

(73) Assignees: IonQ, Inc., College Park, MD (US);
University of Maryland, College Park,
College Park, MD (US); **Duke
University**, Durham, NC (US)

( * ) Notice: Subject to any disclaimer, the term of this
patent is extended or adjusted under 35
U.S.C. 154(b) by 1021 days.

(21) Appl. No.: 17/732,871

(22) Filed: Apr. 29, 2022

(65) Prior Publication Data

US 2022/0253739 A1 Aug. 11, 2022

Related U.S. Application Data

(63) Continuation of application No. 16/708,025, filed on
Dec. 9, 2019, now Pat. No. 11,354,589.

(Continued)

(51) Int. Cl.
*G06N 10/40* (2022.01)
*G06N 10/20* (2022.01)
(Continued)

(52) U.S. Cl.
CPC ............. *G06N 10/40* (2022.01); *G06N 10/20*
(2022.01); *G06N 10/60* (2022.01); *H03K
19/14* (2013.01); *H03K 19/20* (2013.01);
*G02F 1/11* (2013.01)

(58) Field of Classification Search
CPC ........ G06N 10/40; G06N 10/20; G06N 10/60;
H03K 19/14; H03K 19/20; G02F 1/11;
B82Y 10/00
See application file for complete search history.

(56) References Cited

U.S. PATENT DOCUMENTS

2009/0321719 A1* 12/2009 Folman .................. G06N 10/00
977/700
2018/0114138 A1 4/2018 Monroe et al.

FOREIGN PATENT DOCUMENTS

JP 2005134761 A 5/2005

OTHER PUBLICATIONS

Moore, Cristopher, et al. "Parallel Quantum Computation and
Quantum Codes." arXiv preprint quant-ph/9808027 (1998) (Year:
1998).*

(Continued)

*Primary Examiner* — Omar F Fernandez Rivas
*Assistant Examiner* — Michael C. Lee
(74) *Attorney, Agent, or Firm* — ARENTFOX SCHIFF
LLP

(57) ABSTRACT
The disclosure describes various aspects of a practical
implementation of multi-qubit gate architecture. A method is
described that includes enabling ions in the ion trap having
three energy levels, enabling a low-heating rate motional
mode (e.g., zig-zag mode) at a ground state of motion with
the ions in the ion trap; and performing a Cirac and Zoller
(CZ) protocol using the low-heating rate motional mode as
a motional state of the CZ protocol and one of the energy
levels as an auxiliary state of the CZ protocol, where
performing the CZ protocol includes implementing the
multi-qubit gate. The method also includes performing one
or more algorithms using the multi-qubit gate, including
Grover's algorithm, Shor's factoring algorithm, quantum
approximation optimization algorithm (QAOA), error cor-
(Continued)

100 ⟍ rection algorithms, and quantum and Hamiltonian simulations. A corresponding system that supports the implementation of a multi-qubit gate architecture is also described.

18 Claims, 8 Drawing Sheets

Related U.S. Application Data

(60) Provisional application No. 62/789,875, filed on Jan. 8, 2019.

(51) Int. Cl.
G06N 10/60 (2022.01)
H03K 19/14 (2006.01)
H03K 19/20 (2006.01)
G02F 1/11 (2006.01)

(56) References Cited

OTHER PUBLICATIONS

Cortes-Huerto, R., et al. "Structural changes in quasi-one-dimensional many-electron systems: From linear to zigzag and beyond." Physical Review A—Atomic, Molecular, and Optical Physics 82.1 (2010): 013623 (Year: 2010).*

Eble, Johannes. Versatile operations with calcium and multi-species ion crystals. Diss. Universität Ulm, 2012 (Year: 2012).*

Roos, Christian. "Quantum information processing with trapped ions." Fundamental Physics in Particle Traps. Berlin, Heidelberg: Springer Berlin Heidelberg, 2014, pp. 253-291 (Year: 2014).*

Childs, Andrew M., et al. "Toward the first quantum simulation with quantum speedup." arXiv preprint arXiv:1711.10980 (2017) (Year: 2017).*

Ruster, Thomas. Entanglement-based magnetometry in a scalable ion-trap quantum processor. Diss. Johannes Gutenberg—Universität Mainz, 2017 (Year: 2017).*

Bapat, Aniruddha, et al. "Bang-bang control as a design principle for classical and quantum optimization algorithms." arXiv preprint arXiv:1812.02746 (2018) (Year: 2018).*

Paler, Alexandru. "Controlling distilleries in fault-tolerant quantum circuits: problem statement and analysis towards a solution." Proceedings of the 14th IEEE/ACM International Symposium on Nanoscale Architectures. 2018 (Year: 2018).*

Felloni Sara et al., "An Error Model for the Cirac-Zoller CNOT Gate", Institute for Computer Sciences, Social-Informatics and Telecommunications Engineering, 2010, vol. 36, 10 pages.

International Search Report and Written Opinion corresponding to International Application No. PCT/US2019/065855, dated Apr. 14, 2020.

Cirac J. I, et al., "Quantum Computations with Cold Trapped Ions", Physical Review Letters, American Physical Society, US, vol. 74, No. 20, May 15, 1995 (May 15, 1995), pp. 4091-4094, XP000910353, ISSN: 0031-9007, DOI: 10.1103/PHYSREVLETT.74.4091 cited in the application p. 4091-p. 4094.

Ashley Montanaro: "Quantum algorithms: an overview", NPJ Quantum Information, vol. 2, No. 1, Jan. 12, 2016 (Jan. 12, 2016), XP055617622, DOI: 10.1038/npjqi.2015.23.

Marek Sasura, et al., "Cold trapped ions as quantum information processors", Journal of Modern Optics, vol. 49, No. 10, Aug. 1, 2002 (Aug. 1, 2002), pp. 1593-1647, XP055680211, London, GB, ISSN: 0950-0340, DOI: 10.1080/09500340110115497.

Wineland, D.J., et al., "Experimental Issues in Coherent Quantum-State Manipulation of Trapped Atomic Ions", National Institute of Standards and Technology, Journal of Research, vol. 103, No. 3, May 1, 1998 (May 1, 1998), pp. 259-328 XP055680217, US, ISSN: 1044-677X, DOI: 10.6028/jres. 103.019.

Johanning, M. et al., "Individual addressing of trapped ions and coupling of motional and spin states using of radiation", ARIXV. org, Cornell University Library, 201 Olin Library Cornell University Ithaca, NY, 14853, Dec. 29, 2007 (Dec. 29, 2007), XP080350679, DOI: 10.1103/PHYSREVLETT. 102.073004.

S. Debnath, et al., "Demostration of a small programmable quantum computer with atomic qubits", Nature, vol. 536, No. 7614, Aug. 4, 2016 (Aug. 4, 2016), pp. 63-66, XP05552682, London, ISSN: 0028-0836, DOI: 10.1038/nature18648 pp. 63-66.

Kumar, Preethika, Direct implementation of an N-quibit controlled-unitary gate in a single step, Quantum INf Process, 2013, 23 pages.

Maslov, Dmitri, et al. Use of Global Interactions in Efficient Quantum Circuit Constructions, New Journal of Physics, vol. 20, 2018, 14 pages.

Maslov, Dmitri, Advantages of Using Relative-Phase Toffoli Gates with an Application to Multiple Control Toffoli Optimization, Physical Review, vol. 93, 2016, 12 pages.

Office Action in JP2021539854, mailed Sep. 26, 2023, 3 pages.

* cited by examiner

Computer Device 400

Processor 410

Memory 420

Communications Component 430

Data Store 440

User Interface 450

Operating System 460

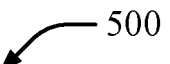

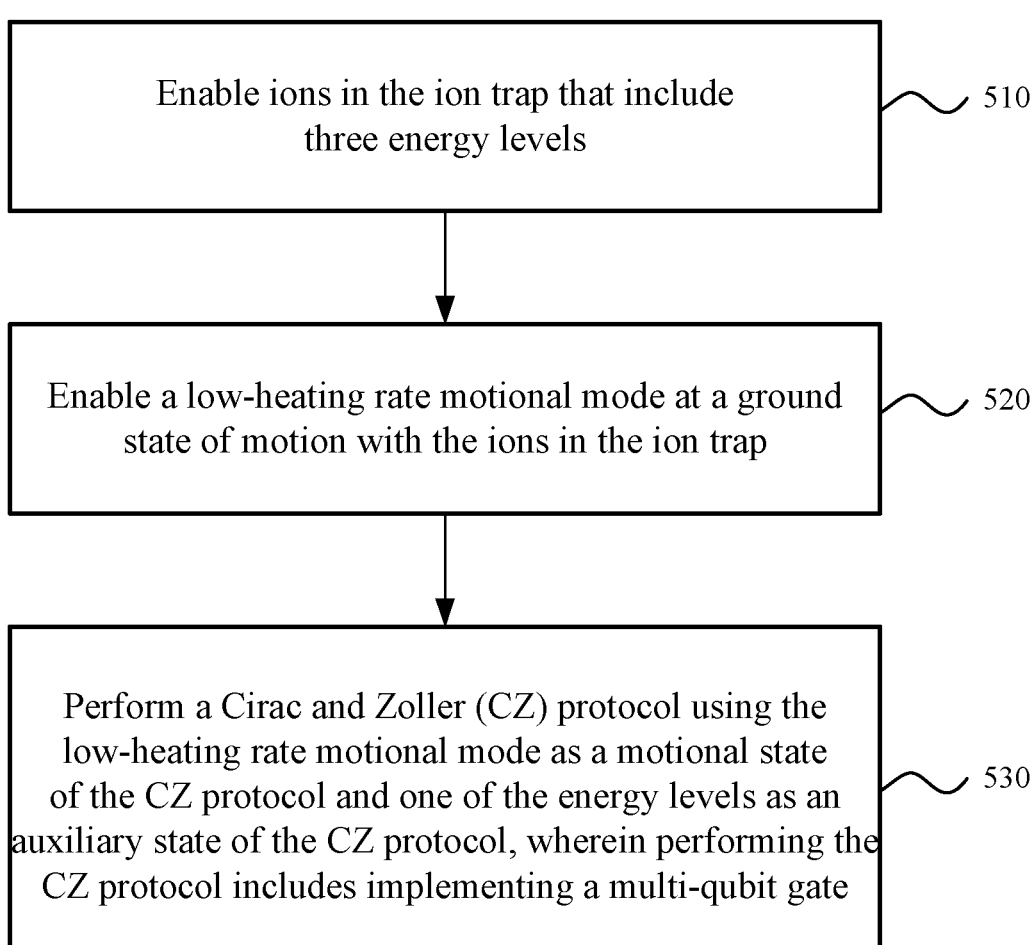

Enable ions in the ion trap that include three energy levels — 510

Enable a low-heating rate motional mode at a ground state of motion with the ions in the ion trap — 520

Perform a Cirac and Zoller (CZ) protocol using the low-heating rate motional mode as a motional state of the CZ protocol and one of the energy levels as an auxiliary state of the CZ protocol, wherein performing the CZ protocol includes implementing a multi-qubit gate — 530

Algorithms component 610

Grover's algorithm component 611

QAOA component 612

Shor's factoring algorithm component 613

Error correction component 614

Quantum simulations component 615

Hamiltonian simulations component 616

QUANTUM COMPUTER ARCHITECTURE BASED ON MULTI-QUBIT GATES

CROSS REFERENCE TO RELATED APPLICATIONS

The present application is a continuation of prior U.S. patent application Ser. No. 16/708,025, filed on Dec. 9, 2019 which claims priority to and the benefit from U.S. Provisional Patent Application No. 62/789,875, entitled "QUANTUM COMPUTER ARCHITECTURE BASED ON MULTI-QUBIT GATES," and filed on Jan. 8, 2019, the contents of each of which are incorporated herein by reference in their entirety.

BACKGROUND OF THE DISCLOSURE

Aspects of the present disclosure generally relate to quantum systems, and more specifically, to a practical implementation of a multiple-qubit gate architecture in a trapped ion system for performing quantum operations.

Conventional quantum computer architectures that can be considered for practical implementations are based on the execution of a basic universal set of gates, often defined by single qubit gates and two-qubit gates. This mainly arises from the fact that multiple-qubit gates (or multi-qubit gates) are difficult to reliably realize in practice. In trapped ion systems, direct implementation of multi-qubit gates have been proposed and even demonstrated in experiments, although with low quality. Multi-qubit gates assembled from several single- and two-qubit gates have performed better, and has been the preferred method of approach so far. Systematic design efforts to build computational machines out of such an approach have been lacking because of the difficulty of practical implementation.

The huge advantage of operating quantum computers based on arbitrary multi-qubit gate stems from the efficient ways different algorithms decompose into the native instruction sets of a quantum computer or quantum information processing (QIP) system. For example, a controlled-n-controlled NOT gate (e.g., a three-qubit gate also known as the Toffoli gate) is the basis of many quantum algorithms such as arithmetic circuits, optimization algorithms and the Grover's algorithm, and typically requires that it be decomposed into six (6) two-qubit gates (e.g., CNOT gates) so that it can be practically implemented. So, rather than having to take a single multi-qubit gate and decompose it into many smaller native operations (e.g., two-qubit gates), being able to execute such multi-qubit gates as its own single native operation can make the implementation of a wide range of quantum algorithms much more effectively in a quantum computer or QIP system.

Accordingly, techniques that allow for a practical implementation of flexible multi-qubit gates for quantum computations, including the implementation in a chain of trapped ion qubits, are desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

The disclosure describes techniques for a practical implementation of a multi-qubit gate architecture in a trapped ion system for quantum computations. Moreover, the disclosure describes various application circuits that can be implemented in such an architecture for performance gains.

In an aspect of the disclosure, a method for implementing a multi-qubit gate using an ion trap is described that includes enabling ions in the ion trap that include three energy levels, enabling a low-heating rate motional mode at a ground state of motion with the ions in the ion trap, and performing a Cirac and Zoller (CZ) protocol using the low-heating rate motional mode as a motional state of the CZ protocol and one of the energy levels as an auxiliary state of the CZ protocol, wherein performing the CZ protocol includes implementing the multi-qubit gate using at least a subset of the ions in the ion trap.

In another aspect of the disclosure, a system for implementing a multi-qubit gate in an ion trap is described that includes the ion trap with multiple ions that include three energy levels, an optical controller configured to control the ions in the ion trap, a configuration component, wherein the configuration component is configured to enable a low-heating rate motional mode at a ground state of motion with the ions in the ion trap, and perform, with at least the optical controller, the CZ protocol using the low-heating rate motional mode as a motional state of the CZ protocol and one of the energy levels as an auxiliary state of the CZ protocol, wherein the CZ protocol implements the multi-qubit gate using at least a subset of the ions in the ion trap.

Described herein are methods, apparatuses, and computer-readable storage medium for various aspects associated with the implementation of a multi-qubit gate architecture in a trapped ion system and application circuits for such an architecture.

BRIEF DESCRIPTION OF THE DRAWINGS

The appended drawings illustrate only some implementation and are therefore not to be considered limiting of scope.

FIG. 5 is a flow diagram that illustrates an example of a method in accordance with aspects of this disclosure.

DETAILED DESCRIPTION

Figure 1:
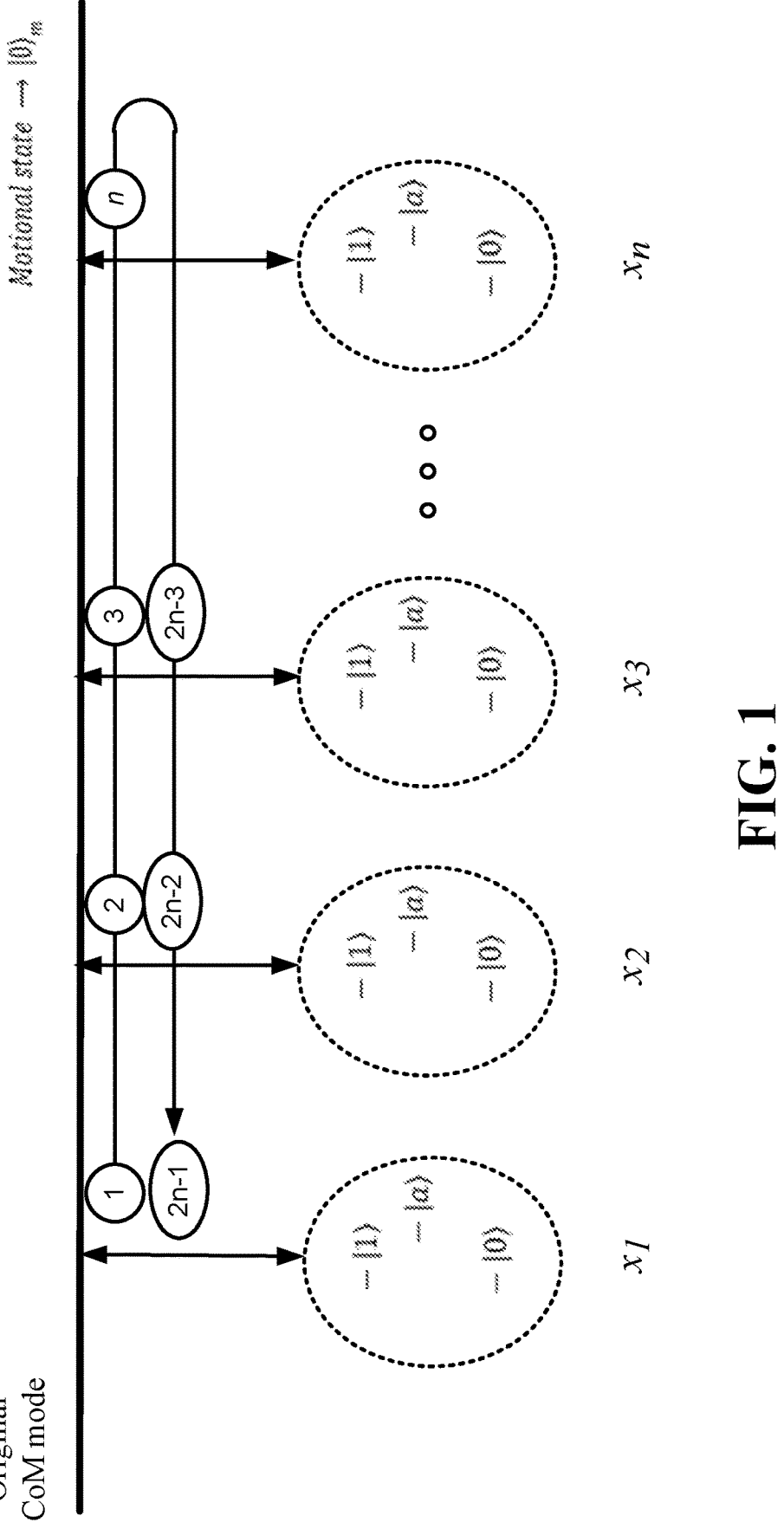
FIG. 1 illustrates an example of a general description of a protocol for implementing multi-qubit gates in accordance with aspects of the disclosure.

The detailed description set forth below in connection with the appended figures is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

In their original work, Cirac and Zoller (CZ) described a protocol for realizing or implementing multi-qubit gates or multi-control gates, such as the n-controlled Z gate ($C^n$-Z gate) (see e.g., Quantum Computations with Cold Trapped Ions, Phys. Rev. Lett. 74, 4091, published May 15, 1995). An example where a n-controlled Z gate is used is a controlled-controlled-NOT gate (CCNOT), which uses two controls (CC-Z, plus two Hadamard gates) and is also known as a Toffoli gate. The Toffoli gate is a 3-qubit gate that is a universal gate for quantum computation. N-controlled Z gates can be implemented for a larger number of qubits (e.g., for more than the three qubits of a Toffoli gate). For example, in a case when there is a set of 4 qubits (e.g., a subset of qubits 1, 3, 4, and 6 from a larger set of qubits) at states $x_1$, $x_3$, $x_4$, and $x_6$, the sign of qubit 6 is flipped if the control qubits 1, 3, and 4 are in the state "1" and qubit 6 is also in the state of "1", otherwise the sign of qubit 6 is not flipped, that is, qubit 6 is left unchanged. Changing the sign of qubit 6 effectively changes the sign of the overall quantum state involving the four qubits in this example. Since the n-controlled Z gate basically flips the sign of the overall state of the qubits involved if and only if all qubits are in the "1" state, there is no special designation for the "target". When qubit 6 is supplemented with two Hadamard gates before and after the n-controlled Z gate is applied, this is an example of a controlled-controlled-controlled NOT gate (CCCNOT) having three controls, where qubits 1, 3, and 4 are the controls. In general, a n-controlled Z gate can be turned into a n-controlled NOT gate by applying two Hadamard gates on either side to one "special" qubit, which turns that qubit into the target qubit. The n-controlled Z gate is a very particular gate and the protocol described by Cirac and Zoller, while theoretically possible, was challenging to implement in real life with high fidelity.

In 1999, Mølmer and Sørensen proposed a two-qubit gate (referred to as an MS gate hereafter) for quantum computing. This gate was found to be more practical for implementation than the gates proposed using the Cirac and Zoller (CZ) protocol. The MS gate overcame many of the real challenges and non-idealities of the CZ protocol-based gates or CZ gates, such as the sensitivity to the ions' thermal motion. High-fidelity implementation of the CZ gate requires the ion motion to be cooled to and maintained at the quantum mechanical ground state, which adds experimentally challenging requirements. As a result, few people are looking at the CZ protocol these days because it is very hard to implement and there is a viable alternative. Consequently, current architectures for building quantum computers or quantum information processing (QIP) systems are based on the use of MS gates.

CZ gates, however, are desirable because with them it is possible to directly implement certain multi-qubit gates and they are flexible by allowing the picking or selection of any n qubits from a larger set of qubits with which to implement multi-qubit gates, making CZ gates advantageous over MS gates for efficient execution of some important quantum algorithms. While MS gates can be used to implement multi-qubit gates, that typically is limited to a uniform combination of pair-wise (two-qubit) interactions among all possible pairs in the qubit set and not the multi-qubit interaction as is possible with CZ gates, making the use of MS gates less effective than CZ gates in many algorithm implementations. An example of such an approach is described in U.S. patent application Ser. No. 16/234,112, titled "USE OF GLOBAL INTERACTIONS IN EFFICIENT QUANTUM CIRCUIT CONSTRUCTIONS" and filed on Dec. 27, 2018, the contents of which are incorporated herein by reference.

Current QIP systems based on trapped ion technology (e.g., that use ion traps, also referred to as surface traps) may provide a framework where CZ gates can be implemented by circumventing the problems and challenges initially found with their implementation. This would then allow for various types of algorithms to be broken down into more efficient ways with the use of CZ gates. Certain problems break down very naturally into what are referred to as primitive gates. If these primitive gates can be implemented in a quantum computer or a QIP system, then the respective problem can be solved very effectively. For example, a $C^4$-Z gate to be implemented with two-qubit gates may require as many as 15 or 16 MS gates. So it may take many two-qubit gates to break down a $C^n$-Z gate, which in turn can be implemented using a single multi-qubit gate such as CZ gate. In another example, a typical number of two-qubit gates (such as CNOT gates) that are needed to realize an n-controls NOT gate scales linearly with n (~An, where A is a constant, of about 12). While in principle it may be possible to take a multi-qubit gate and break it down into pairwise gates (e.g., two-qubit MS gates), this approach is not very effective as many MS gates are needed in most cases. Furthermore, if the system is limited to applying two-qubit gates to nearest neighbors (or other constraints), the general gate count can increase further due to these constraints depending on the distribution of the n+1 qubits that participate in the gate within the rest of the qubit system.

This disclosure describes various aspects of how to implement CZ gates effectively using trapped ion technology and how, once the CZ gates are implemented, various kinds of algorithms and/or computations can be performed with the CZ gates in a very efficient manner.

First, in order to implement CZ gates using trapped ion technology, it may be necessary to use three (3) separate energy levels within the individual atom or ion. These may be referred to as the $|0\rangle$ and $|1\rangle$ of the qubit state and $|a\rangle$ as some form of auxiliary state that is available (see e.g., FIG. 1). So each atom or ion in an ion trap or surface trap being used as part of the trapped ion technology will have this configuration. In current trapped ion systems, one focuses on utilizing only two energy levels in the atoms or ions.

Second, once the charged atoms are loaded into a trap, they all interact with each other due to Coulomb interaction (mutual repulsion due to charge), and this interaction leads to coupled motion of the ions' positions in the chain, referred to as a motional state. That is, if any one of the ions is shaken, then all of the ions will shake. If there are k ions then there will be 3 k normal modes of motion or motional states (k normal modes for each of the x, y and z directions). Focusing on one of the directions (for example, one of the two transverse modes in a chain of ions), a trivial one of these modes of motion is the center-of-mass (CoM) mode where all of the charged atoms (ions or atomic ions) move together. Another one of these modes of motions is the zig-zag mode where adjacent ions move in opposite directions (see e.g., FIG. 2B). As described above, for the CZ gates a mode in which all of the ions are coupled is desirable to allow for multi-body interactions. The CoM mode and the zig-zag mode are examples of such modes, where if one of the ions is hit (e.g., motion is excited), the motion of all of the other ions gets excited. A condition for implementing CZ gates is then to pick or select a mode where all of the ions are very well coupled to their motional state.

As proposed by Cirac and Zoller, the mode to be used was the CoM mode. This presents a series of challenges, which is why the original protocol for implementing CZ gates was not widely used and MS gates came to be the preferred approach instead.

FIG. 1 shows a diagram 100 that illustrates a general description of the original protocol for implementing multi-qubit gates as proposed by Cirac and Zoller. As part of the original protocol, the motional state, the CoM mode, needs to be brought down to a ground state of motion (e.g., $|0\rangle_m$). That is, the motional state needs to be cooled by having all the motional quanta removed and then having the motional state sit at the quantum mechanical ground state of motion during the duration of the gate. This is typically not easy to do but current ion trap technology is now capable of bringing and maintaining a motional state at the ground state of motion.

There may be multiple states to consider, which in the diagram 100 are shown as $x_1, x_2, x_3, \ldots, x_n$ corresponding to the qubits (e.g., ions) to be used to implement a multi-qubit gate. It is to be understood that these states are provided by way of illustration and the protocol has the flexibility to use the states of any set or subset of ions in a trap. As part of the protocol, the first state, $x_1$, interacts first with the motional state which is the CoM mode (operation 1), then the next state, $x_2$, interacts with the motional state (operation 2), then the next state, $x_3$, interacts with the motional state (operation 3), and this continues until the last state, $x_n$, interacts with the motional state (operation n). A laser or optical beam may be used to excite the various states to interact with the motional state.

Once this part of the protocol is done, then the protocol continues by going back down and having the various states interact in reverse order with the motional state. For example, state $x_3$ interacts with the motional state (operation 2n–3), state $x_2$ interacts with the motional state (operation 2n–2), and finally state $x_1$ interacts with the motional state (operation 2n–1). Thus, the overall protocol goes up the states as it interacts with the motional state and then comes down the states as it interacts again with the motional state, with the interactions involving the separate energy levels and the motional state, which in this case is the CoM state. At the end of the protocol the result is a very specific multi-qubit gate.

One of the challenges with using the approach outlined above in connection with the diagram 100 in FIG. 1 is that after bringing the motional state to a ground state of motion and performing the various operations of the protocol, the motional state will be in a particular (entangled and superposed) state of ground state and an excited state with only one excitation, and cannot change from this specific state of motion, otherwise the protocol does not work and the multi-qubit gate does no operate as expected. But there is always some natural or induced heating that takes place on the motional state. For example, the presence of some electric field fluctuations in the trap holding the ions (e.g., the qubits) can cause the motional state to get excited and cause it to move out of the specific state of motion created during the gate process. In other words, heating can take the motional state from the particular state (composed only of the ground state and an excited state with only one excitation) and turn it into a thermal state, which in turn makes the protocol/multi-qubit gate perform poorly. Because it is difficult to keep the CoM mode cool all the time, the original CZ protocol for implementing multi-qubit gates is very difficult to implement in practice with high fidelity.

This disclosure proposes a different approach. Rather than using a CoM mode for the motional state, low-heating rate modes (e.g., a motional mode with high spatial frequency) are proposed instead for the implementation of multi-qubit gates. In addition, this disclosure proposes the use of Zeeman levels or D levels (e.g., meta-stable excited states) for auxiliary states, where various methods can be used for improving the coherence time of those states (e.g., the use of Ytterbium (Yb) and Barium (Ba) schemes). Other features being proposed in this disclosure include an optical addressing scheme for realizing the system, gate design to make it robust against mode frequency drift using amplitude modulation/frequency modulation (AM/FM)-like techniques, the use of compensated pulse techniques for making the red-sideband pi ($\pi$) and 2pi ($2\pi$) pulses robust against laser intensity drifts, as well as consideration of spin and motional phases and how to control them robustly.

Figure 2A:
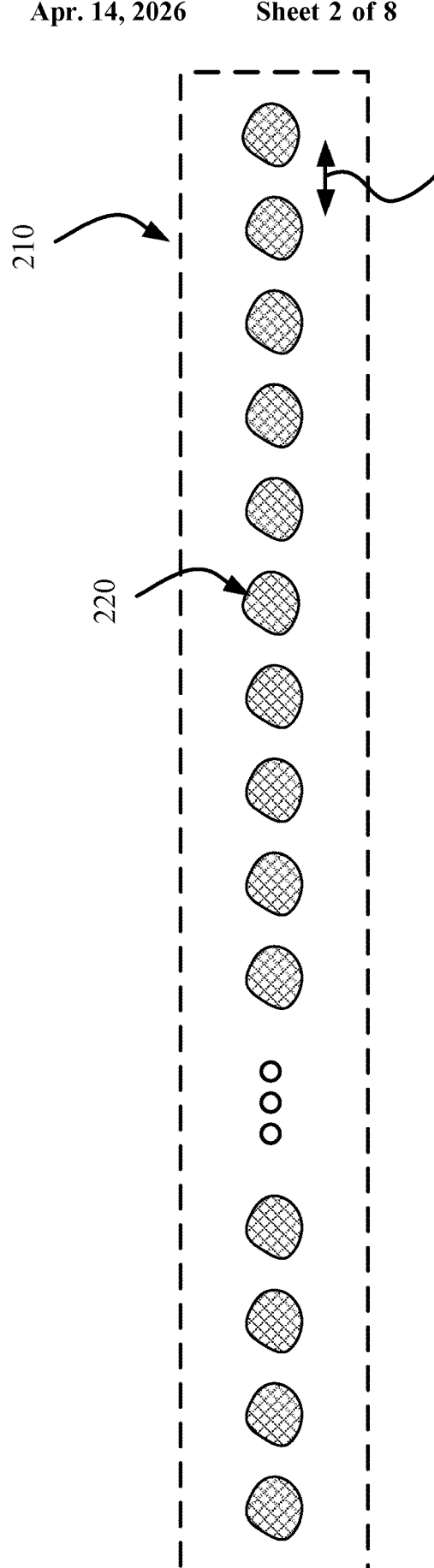
FIG. 2A illustrates a view of the trapping of atomic ions in a linear crystal in accordance with aspects of the disclosure.

With respect to the motional state, one approach is to use zig-zag modes or something close to a zig-zag mode for the low-heating rate modes. FIG. 2A illustrates a diagram 200$a$ of the trapping of atomic ions 220 in a linear crystal 210, where the atomic ions 220 (e.g., qubits) can be excited to a zig-zag mode as shown in a diagram 200$b$ in FIG. 2B. The linear crystal 210 can be formed in a vacuum chamber that houses electrodes as part of an ion trap (see e.g., ion trap 670 in FIG. 6A) for confining the atomic ions 220.

Referring back to the diagram 200$a$ in FIG. 2A, the atomic ions 220 that are trapped and form the linear crystal 210 may be used to implement quantum information processing, and therefore, the multi-qubit gates needed for such processing. Atomic-based qubits can be used as different type of devices, including but not limited to quantum memories, quantum gates in quantum computers and simulators, and nodes for quantum communication networks. Qubits based on trapped atomic ions can have very good coherence properties, can be prepared and measured with nearly 100% efficiency, and can be readily entangled with each other by modulating their Coulomb interaction with suitable external control fields such as optical or microwave fields. As used in this disclosure, the terms "atomic ions," "atoms," and "ions" may be used interchangeably to describe the particles that are to be confined, or are actually confined, in a trap to form a crystal or similar arrangement or configuration.

The typical ion trap geometry or structure used for quantum information and metrology purposes is the linear radio frequency (RF) Paul trap (also referred to as an RF trap, surface trap, or simply a Paul trap), where nearby electrodes hold static and dynamic electrical potentials that lead to an effective inhomogeneous harmonic confinement of the ions. The RF Paul trap is a type of trap that uses electric fields to trap or confine charged particles in a particular region, position, or location. When atomic ions are laser-cooled to very low temperatures in such a trap, the atomic ions form a stationary crystal of qubits (e.g., a structured arrangement of qubits), with Coulomb repulsion balancing the external confinement force. For sufficient trap anisotropy, the ions can form a linear crystal along the weak direction of confinement, and this is the arrangement typically employed for applications in quantum information and metrology. As mentioned above, electric field fluctuations, possibly caused by the nearby electrodes in the trap, can heat the motional state from a ground or zero mode or state to a thermal state.

In the example shown in the diagram 200a, Ytterbium ions (e.g., $^{171}Yb^+$ ions) which are confined in the linear crystal 210 are laser-cooled to be nearly at rest. The number of atomic ions 220 trapped can be configurable. In this example, atomic ions 220 are separated by a distance 215 of about 5 microns (μm) from each other as shown by fluorescence. The separation of the atomic ions is determined by a balance between the external confinement force and Coulomb repulsion.

Strong fluorescence of individual trapped atomic ions relies on the efficient cycling of photons, thus the atomic structure of the ion must have a strong closed optical transition that allows for laser-cooling of the motion, qubit state initialization, and efficient qubit readout. This may rule out many atomic ion species, apart from simple atomic ions with a lone outer electron, such as the alkaline-earths ($Be^+$, $Mg^+$, $Ca^+$, $Sr^+$, $Ba^+$) and particular transition metals ($Zn^+$, $Hg^+$, $Cd^+$, and $Yb^+$). Within these atomic ions, quantum bits can be represented by two stable electronic levels, often characterized by an effective spin with the two states $|\uparrow\rangle$ and $|\downarrow\rangle$, or equivalently $|1\rangle$ and $|0\rangle$.

For coherent transitions between qubit levels, there can be single qubit rotation operations and entangling multi-qubit operations. Single qubit rotation operations may also be referred to as single qubit operations or simply as qubit flipping. With respect to entangling multi-qubit operations, the motion of many trapped ions is coupled through the Coulomb interaction, much like an array of pendulums that are connected by springs. A natural way to implement entangling quantum logic gates between atomic ions in a crystal is to use the motion as an intermediary.

Figure 2B:
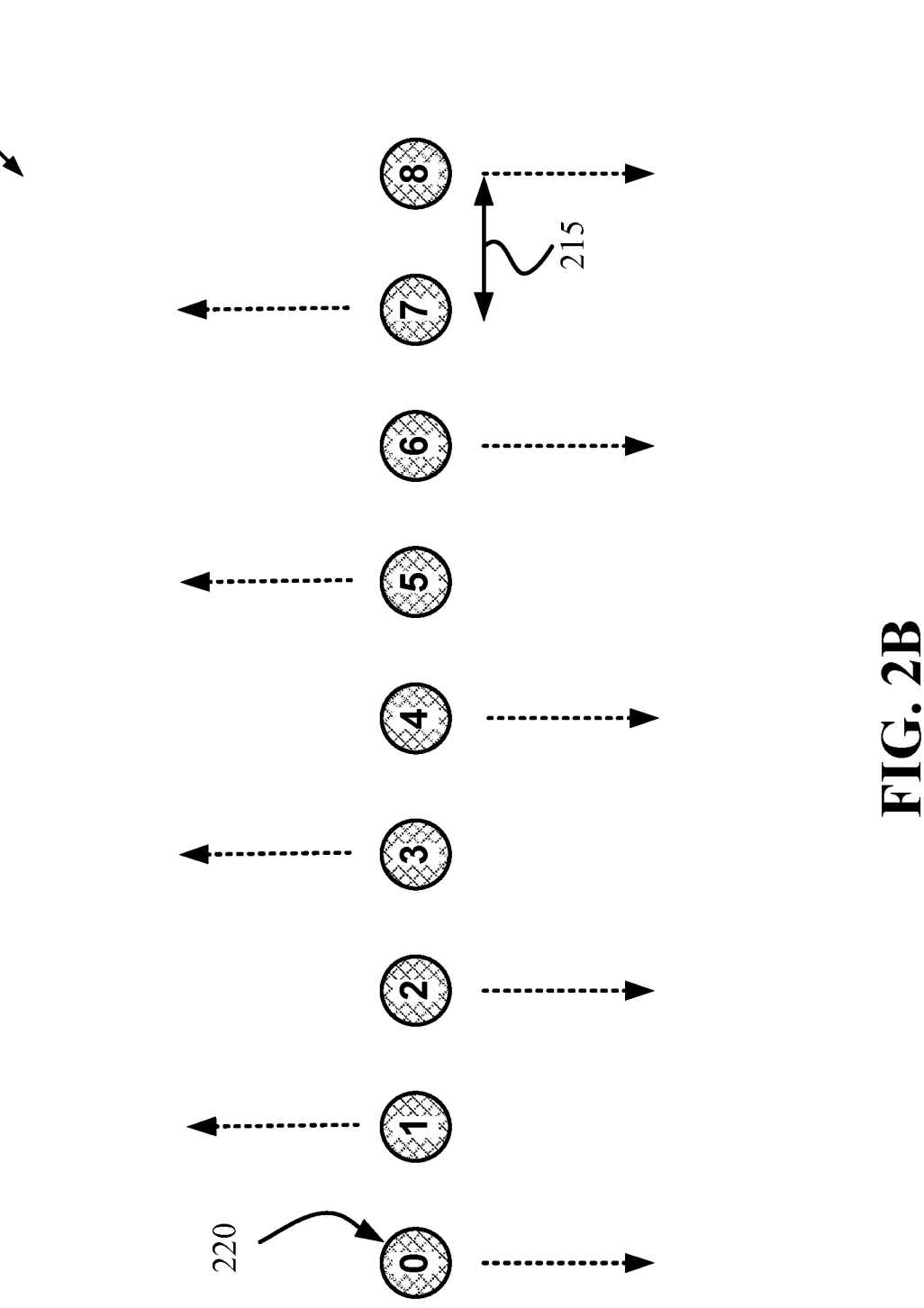
FIG. 2B illustrates an example of a zig-zag mode with trapped atomic ions in accordance with aspects of the disclosure.

Referring back to the diagram 200b in FIG. 2B, an example is shown where several atomic ions 220 are arranged in a zig-zag mode with adjacent ions moving in opposite directions as indicated by the arrows. This mode has a well-defined frequency based in part on the spacing 215 between the atomic ions 220. Because of its high spatial frequency, it turns out that this mode does not heat up very well (e.g., it is a low-heating rate mode). That is, once the zig-zag mode is cooled down to its ground state of motion, the way to excite this mode out of its ground state of motion is to have the electric field noise or fluctuations caused by, for example, the electrodes in the trap, have spatial pattern or profile that matches closely the spatial profile of the zig-zag mode. Given that the atomic ions 220 are separated by about 5 μm from each other, it is very unlikely that any existing low noise electric field fluctuations will match the spatial pattern or profile of the zig-zag mode. Accordingly, the zig-zag mode will generally stay in its ground state of motion, which is desirable if the zig-zag mode is to be used as the motional state for the CZ protocol to implement multi-qubit gates.

Another condition to implement CZ gates effectively using trapped ion technology is to have three (3) separate energy levels, which in the diagram 100 in FIG. 1 are shown as, $|0\rangle$, $|1\rangle$, and the auxiliary state $|a\rangle$. As mentioned above, this disclosure proposes the use of Zeeman levels or D levels (e.g., meta-stable excited states) for the auxiliary state $|a\rangle$. To enable this the operating environment needs to be fairly stable by having, for example, good magnetic field shielding (or other forms of shielding) protecting the atomic ions 220.

Figure 3:
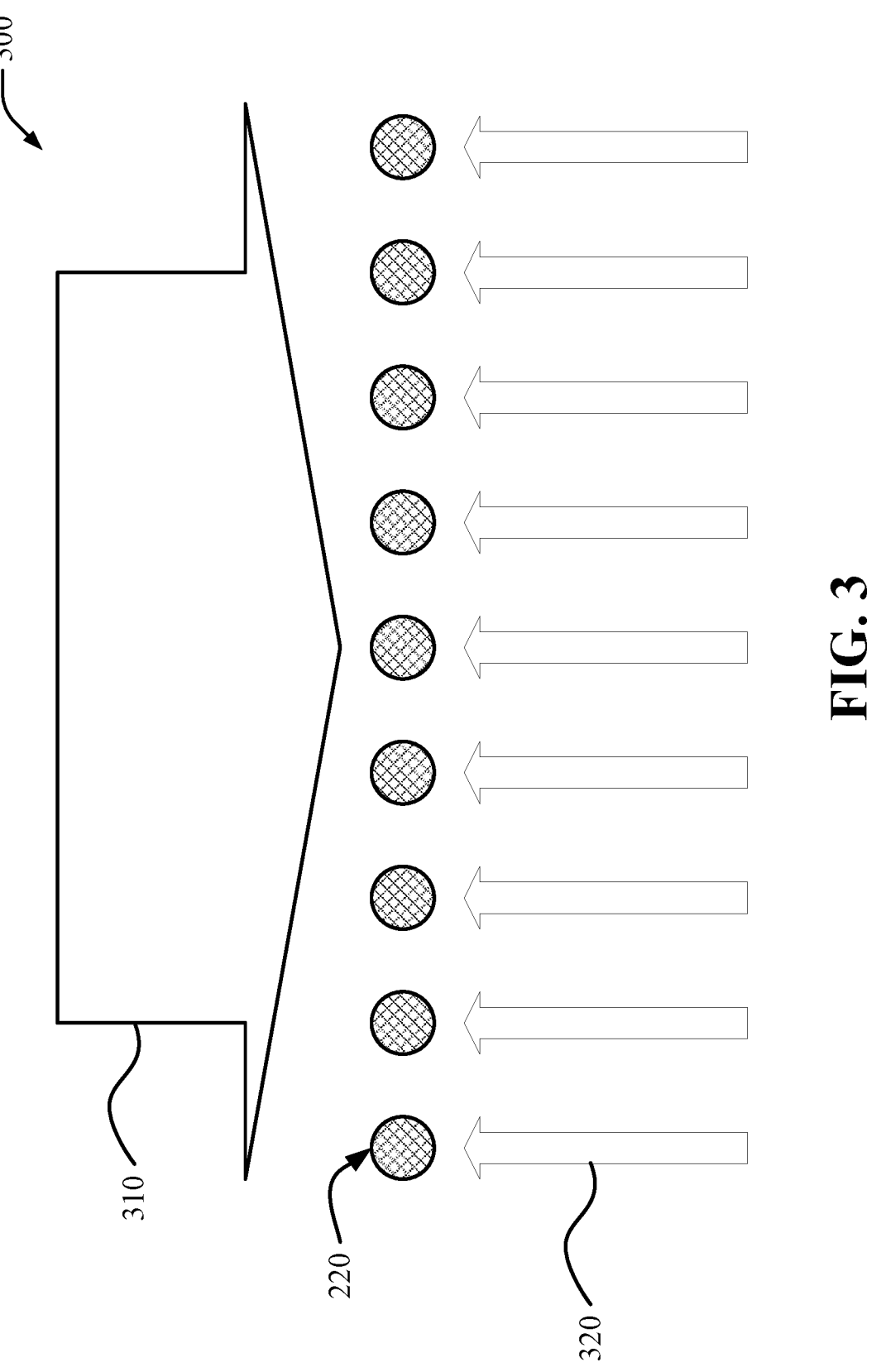
FIG. 3 illustrates an example of an optical addressing scheme for implementing multi-qubit gates using trapped atomic ions in accordance with aspects of this disclosure.

An optical scheme that can be used as part of a quantum computer or QIP system to enable the implementation and use of multi-qubit gates is described in a diagram 300 in FIG. 3, where a single, broad optical beam 310 is applied to all of the atomic ions 220 from one direction and each of the atomic ions 220 is then individually addressed (e.g., individually controlled) with a dedicated optical beam 320 from another direction. In this example, these two beams drive Raman transition among the different qubit levels (typically in the ground state). The directions of the beams 310 and 320 can be 180 degrees from each other (e.g., opposite directions) or 90 degrees from each other (e.g., perpendicular or normal directions). By having optical beams in such a configuration, and by using proper polarization, it is possible to address the qubit states and the auxiliary states of an individual atomic ion 220. When use of D levels is desired, a frequency-stabilized laser beam focused on each ion can be used to drive the transition to the D-level.

Another aspect associated with the implementation and use of multi-qubit gates based on trapped ion technology is that the trapping potential that confines the ions may fluctuate over time, which may cause the frequency of the motional state (e.g., a mode frequency) to drift a little. Although this drift in mode frequency can be stabilized in principle, in realistic cases it does drift and the system needs to be able to handle the changes in frequency when they do occur. When a multi-qubit gate is implemented and there are interactions with it, it is important to know exactly what the frequency of the mode is so that techniques can be used that make the interactions robust against drifts. For example, by performing amplitude modulation (AM) and/or frequency modulation (FM) on the laser or optical beam involved in the interactions (e.g., by using an acousto-optic modulator (AOM)), it is possible to adjust and/or design the pulse or pulse sequences provided by the laser beam to make them more robust against frequency drifts. That is, the pulse or pulse sequences can be made to be less sensitive to frequency drifts and/or to compensate for the frequency drifts by AM and/or FM modulation.

Yet another aspect associated with the implementation and use of multi-qubit gates based on trapped ion technology is that there are instances in which a laser or optical beam is used to interact with the multi-qubit gate and the intensity of the laser beam changes or drifts over time. Although it may be possible to directly adjust the intensity of the laser beam, this may not be sufficient to get the levels of accuracy needed (e.g., accuracy to $10^{-4}$). An approach that may be used in this case is the application of compensated pulse or compensated sequence techniques, where instead of a pulse being shined on the multi-qubit gate, a sequence of pulses with changing phase are used to produce an overall stable laser beam intensity. Similar approaches have been used in nuclear magnetic resonance (NMR) and can be applicable to multi-qubit gates.

As described above, this disclosure proposes the use of higher order modes for the motional state (e.g., zig-zag modes, low-heating rate modes, high spatial frequency modes) and the use of internal states of the atom as the auxiliary states (e.g., Zeeman levels or D levels) to realize the CZ protocol while overcoming the problems and challenges that made the CZ protocol difficult to implement in the first place. This then allows the direct implementation of multi-qubit gates (e.g., n-controlled Z gate or $C^n$-Z gate) instead of having to decompose the gate into a large number of pairwise interactions using two-qubit gates (e.g., MS gates).

With the ability to use trapped ion technology to implement multi-qubit gates or multi-control gates using the various modifications of the CZ protocol discussed above, and with the added ability of maintaining the quality of these types of gates over a long time required for executing a given quantum computation by using, for example, individual optical addressing, mode frequency drift compensation, and/or laser beam intensity drift compensation, it is now possible to perform various algorithms more efficiently.

A first such algorithm is the Grover's algorithm, where the implementation of multi-qubit gates allows for the efficient circuit-level implementation of oracles or similar functions. The Grover's algorithm is an algorithm used to solve satisfiability problem.

The Grover's algorithm can be used in various types of search problems, including in unsorted database searches, whereby performing the search from a quantum computing approach, it is possible to do it in an optimal way that can get up to a quadratic speed improvement over the best classical computing approach. For example, when looking at a phone book organized by last names and the number of a person is provided, in order to find out whose number is the one that was provided in a classical computing approach it is necessary to look at every entry in the phone book until a match is found for the number because the phone book is unsorted in the phone numbers, barring a special case where the phone number is correlated with the last name of a person. So if there are m entries, it is necessary to look m times in the worst case, or m/2 times on average to find the name that matches the number provided. If instead the phone book is stored in a quantum database, what can be done is to create an oracle, which is a construction or function of a predicate to be searched. So while an oracle can recognize an answer, it is not configured to find one.

Typically, an oracle can be constructed to receive a single input and if that input is the right answer, the oracle will return a "1" or similar/equivalent indicator as an output, otherwise if the input is not the right answer, the oracle will return a "0" or similar/equivalent indicator as the output. An oracle therefore allows for a query to be provided as an input, just like when looking up the number in a phone book database. Classically, only one query can be made at a time. The classical oracle then returns output "0" or "1" based on whether the provided input satisfies the pre-assigned condition.

A quantum version of the oracle used in the Grover's algorithm can use as input a superposition of all the states at the same time. For all those input terms for which the pre-assigned condition is satisfied, the quantum oracle will "mark" those entries (in parallel, if there are more). Each iteration of the Grover's operator (which consists of the oracle and an "inversion about the mean" operation) will amplify the probability of the right answers being detected upon measurement. Repeated application of the Grover's operator will quickly evolve an initial state to a state where the measurement will yield a right answer with very high probability. In the Grover's algorithm, the quantum oracle can be run $\sqrt{m}$ times and the probability of finding the answer will be on the order of 1 (~100%). Instead of looking in the order of m times as in the classical case, in the quantum approach it only needs to look in the order of $\sqrt{m}$ times.

If the quantum oracle is a Boolean function, then the quantum oracle can be a n-controlled Z gate or $C^n$-Z gate. In a simple implementation of the Grover's algorithm, the implementation of the $C^n$-Z gate is the quantum oracle. If the quantum oracle is implemented using pairwise interactions with two-qubit gates (e.g., MS gates), this decomposition can end up being very difficult to do depending on the number of qubits, which results in a very complicated circuit. Instead, using a single multi-qubit gate for the implementation of the quantum oracle is far more effective.

A similar type of approach described above in connection with the Grover's algorithm can be used for solving problems with a quantum approximate optimization algorithm (QAOA). The QAOA provides a heuristic approach for solving certain optimization problems, and it takes into account conditions that need to be met and some Boolean clauses. For example, suppose that a given graph includes m vertices or points and edges that connect arbitrary pairs of vertices and the goal is to bipartite the given graph. The QAOA may be used to determine how best to proceed in removing edges to achieve a bipartite separation. QAOA is therefore a type of technique for solving search problems, which could be used to solve optimization problems such as the traveling salesman problem.

In general, the QAOA tries to figure out if these Boolean clauses have been satisfied. To do so, implementing a multi-control operation may be required because such an operation, as applied in a quantum computer or QIP, induces the operation on the target qubit only if all of the control qubits are in one state (e.g., "0" not satisfied, "1" satisfied). Multi-control NOT or multi-control Z gate can thus be used to implement the aforementioned satisfiability-check step easily in a quantum computer. However large the quantum computer (or the size of the satisfiability condition), each condition that needs to be satisfied can be implemented as a single multi-qubit gate. This is very powerful in a quantum setting because it is possible in a quantum computer to load every single pattern at the same time to simultaneously try all of the patterns and find the patterns that satisfy the pre-specified condition.

For example, in some trapped ion systems, it is possible to have 50 or more qubits in an ion trap and there may be conditions where 50 or more bits comprise each clauses. In these cases, the number of bits involved in the clause determines the size of the multi-qubit gate to be used. As such, each clause that is used can turn into a n-controlled NOT gate, where n may be larger than 50, and the conditions of the QAOA can be implemented using these gates.

It is to be understood from this disclosure that being able to implement a multi-qubit or multi-control gate as a native operation is more effective than having to decompose the gate into smaller units of native operations. Moreover, the approach described herein for implementing a multi-qubit or multi-control gate using modifications to the CZ protocol can apply to any arbitrary number of controls (e.g., two or more controls) and may be more flexible than other approaches that use smaller units as the native operation but with a limited number of controls.

There may be additional benefits of performing the techniques described herein over a fully-connected ion trap processor. If a mode like the zig-zag mode is used, where all the ions are coupled, it is possible to implement an arbitrary n-controlled Z gate with almost "flat" cost (or resources) in the sense that while the cost of doing the gate increase as a function of n, the approach described in this disclosure will be almost independent of how those n+1 qubits are distributed within the quantum computer or quantum information processing system.

Moreover, the quantum computer or quantum information processing system can be modular, that is, can have multiple modules of qubits. Examples of such modular systems are descried in U.S. patent application Ser. No. 16/199,993, titled "Software-Defined Quantum Computer" and filed on Nov. 26, 2018, the contents of which are incorporated by reference herein. When the size of the problem or application to be performed is larger than the number of qubits within a single module can handle, it may be possible to "teleport" some qubits between modules, and as long as the size of the "clauses" is smaller than the number of qubits in a module (and therefore can be implemented with a n-controlled NOT or n-controlled Z gate), it is therefore possible to implement the algorithm efficiently.

In addition to the algorithms described above, other applications involve the use of arithmetic, such as additions or multiplications, for example. Integer arithmetic is something that classical computers do quite well. There are instances, however, that arithmetic needs to be performed in quantum computers to solve for, for example, discrete logarithm problems, a generalization of the well-known Shor's factoring algorithm. In Shor's factoring algorithm there are a lot of arithmetic operations that need to be performed up front before applying those results to a quantum Fourier transform (QFT) operation. The arithmetic operations for Shor's factoring algorithm need to be performed using a quantum approach, and such quantum arithmetic circuits typically involve NOT gates, controlled-NOT gates, and controlled-controlled-NOT gates.

As used in this disclosure, a controlled-controlled-NOT gate and a controlled-controlled-Z gate may be considered to be similar or equivalent gates (within two Hadamard gates applied to the target) and, as mentioned above, a controlled-controlled-NOT gate is generally referred to as a Toffoli gate. One of the versatile aspects of the Toffoli gate is that it can be used to write any classical algorithm as it is a universal gate in reversible classical computing. The Toffoli gate thus tends to be used in a quantum computing context when a part of the quantum circuit is motivated by and/or based on reversible classical operations. So quantum circuits that have at least some part based on reversible classical operations will have these types of multi-qubit gates. Some examples of these reversible circuits include reversible logic circuits, especially the Reed-Muller kind, that are applicable to minimization or mapping problems.

In addition to using multi-qubit gates in quantum arithmetic circuits, these types of gates can also be used in quantum error correction codes and their distillation circuits.

Another application of the multi-qubit gates described in this disclosure includes quantum simulations such as the ones used for modeling or simulating various properties of materials. Because some material simulations involve modeling strong correlations between quantum particles (e.g., effective forces in nuclear physics), multi-qubit gates can be used as part of algorithms that simulate the interactions between multiple particles.

Yet another application of the multi-qubit gates described in this disclosure includes the Select-V gate, typically used for Hamiltonian simulations using linear combinations of unitaries or quantum signal processing algorithms. They are the asymptotically-best simulation algorithms, and they may also be utilized to directly implement Toeplitz and Hankel matrices or circulant matrices and their variants for visual tracking. The Select-V gate implementation requires the use of multi-qubit or multi-control gates. Most of these algorithms, however, assume fault tolerance.

Figure 4:
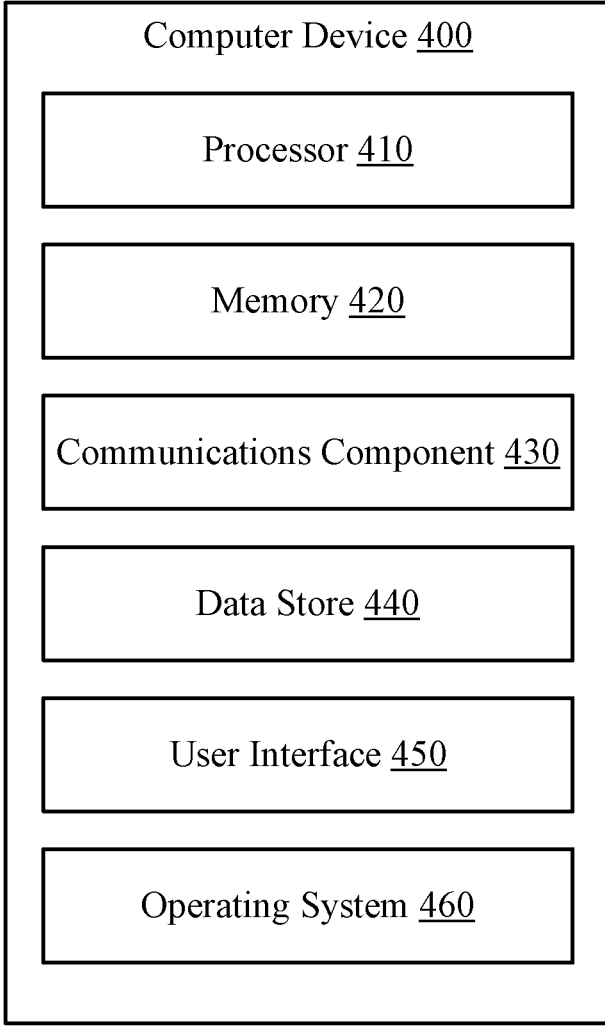
FIG. 4 is a diagram that illustrates an example of a computer device in accordance with aspects of this disclosure.

FIG. 4 shows an example of a computer device 400 that is configured to implement multi-qubit gates using the modified version of the CZ protocol as described above and to perform one or more algorithms that use the multi-qubit gates. In one example, the computer device 400 may include a processor 410 for carrying out processing functions associated with one or more of the features described herein. The processor 410 may include a single or multiple set of processors or multi-core processors. Moreover, the processor 410 may be implemented as an integrated processing system and/or a distributed processing system. The processor 410 may include a central processing unit (CPU), a quantum processing unit (QPU), a graphics processing unit (GPU), or combination of those types of processors. In one aspect, the processor 410 may refer to a general processor of the computer device 400, which may also include additional processors 410 to perform more specific functions such as functions for enabling the implementation of multi-qubit gates and performing various algorithms with such gates.

In an example, the computer device 400 may include a memory 420 for storing instructions executable by the processor 410 for carrying out the functions described herein. In an implementation, for example, the memory 420 may correspond to a computer-readable storage medium that stores code or instructions to perform one or more of the functions or operations described herein. In one example, the memory 420 may include instructions to perform aspects of a method 500 described below in connection with FIG. 5. Just like the processor 410, the memory 420 may refer to a general memory of the computer device 400, which may also include additional memories 420 to store instructions and/or data for more specific functions such as instructions and/or data for implementing multi-qubit gates, maintain those gates in operation, and/or performing algorithms based on those gates.

Further, the computer device 400 may include a communications component 430 that provides for establishing and maintaining communications with one or more parties utilizing hardware, software, and services. The communications component 430 may carry communications between components on the computer device 400, as well as between the computer device 400 and external devices, such as devices located across a communications network and/or devices serially or locally connected to computer device 400. For example, the communications component 430 may include one or more buses, and may further include transmit chain components and receive chain components associated with a transmitter and receiver, respectively, operable for interfacing with external devices.

Additionally, the computer device 400 may include a data store 440, which can be any suitable combination of hardware and/or software, that provides for mass storage of information, databases, and programs employed in connection with implementations described herein. For example, the data store 440 may be a data repository for operating system 460 (e.g., classical OS, or quantum OS). In one implementation, the data store 440 may include the memory 420.

The computer device 400 may also include a user interface component 450 operable to receive inputs from a user of the computer device 400 and further operable to generate outputs for presentation to the user or to provide to a different system (directly or indirectly). The user interface component 450 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 450 may include one or more output devices, including but not limited to a display, a speaker, a haptic feedback mechanism, a printer, any other mechanism capable of presenting an output to a user, or any combination thereof.

In an implementation, the user interface component 450 may transmit and/or receive messages corresponding to the operation of the operating system 460. In addition, the processor 410 may execute the operating system 460 and/or applications, programs, or algorithms, and the memory 420 or the data store 440 may store them.

When the computer device 400 is implemented as part of a cloud-based infrastructure solution, the user interface component 450 may be used to allow a user of the cloud-based infrastructure solution to remotely interact with the computer device 400.

FIG. 5 is a flow diagram that illustrates an example of a method 500 for implementing a multi-qubit gate using an ion trap. In an aspect, the method 500 may be performed in a computer system such as the computer system 400 described above, where, for example, the processor 410, the memory 420, the data store 440, and/or the operating system 460 may be used to perform the functions of the method 500. Similarly, the functions of the method 500 may be performed by one or more components of a QIP system such as the QIP system 605 and its components (e.g., the configuration component 615, the optical controller 620, the ion trap 670, and/or the algorithms component 610 and its subcomponents).

At 510, the method 500 includes enabling ions (e.g., atomic ions 220) in the ion trap that include three energy levels (e.g., qubit states $|0\rangle$, $|1\rangle$, and the auxiliary state $|a\rangle$).

At 520, the method 500 includes enabling a low-heating rate motional mode (e.g., zig-zag mode in the diagram 200b in FIG. 2B) at a ground state of motion with the ions in the ion trap.

At 530, the method 500 includes performing a CZ protocol using the low-heating rate motional mode as a motional state of the CZ protocol and one of the energy levels as an auxiliary state of the CZ protocol (e.g., a modified version of the CZ protocol for practical implementation). Performing the CZ protocol includes implementing the multi-qubit gate. The multi-qubit gate can be implemented using at least a subset of the ions in the ion trap, for example.

In an aspect of the method 500, the multi-qubit gate is a single native gate operation. The multi-qubit gate may be a multi-control qubit gate. The multi-qubit gate may be a n-controlled Z gate or $C^n$-Z gate.

In another aspect of the method 500, the low-heating rate motional mode is a zig-zag mode. The low-heating rate motional mode may be one to which all ions in the trapped ion system are strongly coupled, and the low-heating rate motional mode may have a spatial frequency profile that is different than a spatial frequency profile of background electric field noise. In such an example, the all-to-all connectivity offered by this mode allows one to implement n-controlled Z (or n-controlled NOT) gate among an arbitrary set of qubits in the chain.

In an alternative approach, the implementation of a multi-qubit gate described in this section among a specific set of qubits might utilize a different motional mode that effectively couples all the qubits in the gate, but not other qubits that do not participate in this gate. That is, the motional mode that is picked or selected depends on the ion set on which the gate is applied. For example, if the gate involves ions 1, 3, 16, and 17 in a 17-ion chain, it is possible to use a "rocking" mode where these four ions couple strongly, but some of the ions do not couple very well. This will help manage or minimize the excitation of other ions not participating in the gate. Although this choice of the mode is not universal for any set of ions, the point here is that it is possible to use a different mode depending on the set of ions involved in the gate.

In another aspect of the method 500, the method 500 may include selecting the low-heating rate motional mode based on the ions on which the gate is applied. For example, the low-heating rate motional mode selected can be a rocking mode or a zig-zag mode depending on which ions in chain or crystal are being used for the gate that is being implemented.

In another aspect of the method 500, the auxiliary state is one of a Zeeman ground state (e.g., Zeeman levels) or a meta-stable excited state (e.g., D levels).

Other aspects of the method 500 include implementing the multi-qubit gate using at least a subset of the ions in the ion trap by controlling the subset of the ions using an optical addressing scheme that involves a single, broad optical beam in a first direction and an individual optical beam for each of the ions in the subset of the ions in a second direction. The first and second directions are opposite directions (180 degrees) or the first and second directions are perpendicular or normal directions (90 degrees).

Other aspects of the method 500 include implementing the multi-qubit gate using at least a subset of the ions in the ion trap by modulating optical beams applied to the subset of the ions to compensate for frequency drifts in the motional mode. The modulation may be an amplitude modulation (AM), a frequency modulation (FM), a phase modulation (PM), or any combination of the three. Moreover, the modulation may be performed by one or more AOMs (e.g., the AOMs 645).

Other aspects of the method 500 include implementing the multi-qubit gate using at least a subset of the ions in the ion trap by using or applying optical beams to control the subset of the ions and applying or performing pulse compensation to an intensity of the optical beams to reduce intensity drifts.

The method 500 may further include performing one or more algorithms using the multi-qubit gate. The one or more algorithms may include the Grover's algorithm, and one or more oracles of the Grover's algorithm are implemented using the multi-qubit gate. The one or more algorithms may include the QAOA, and one or more Boolean clause conditions of the QAOA are implemented using the multi-qubit gate. The one or more algorithms may include the Shor's factoring algorithm, and one or more arithmetic circuits of the Shor's factoring algorithm are implemented using the multi-qubit gate, where the multi-qubit gate may be one of a NOT gate, a controlled-NOT gate, or a controlled-controlled-NOT gate. The one or more algorithms may include an error correction algorithm, and distillation circuits of the error correction algorithm are implemented using the multi-qubit gate. The one or more algorithms include a quantum simulation (e.g., a material simulation), and at least one of multi-body interactions performed as part of the quantum simulation is performed using the multi-qubit gate. The one or more algorithms may include Hamiltonian simulations, and a Select-V gate of the Hamiltonian simulations is implemented using the multi-qubit gate.

Figure 6A:
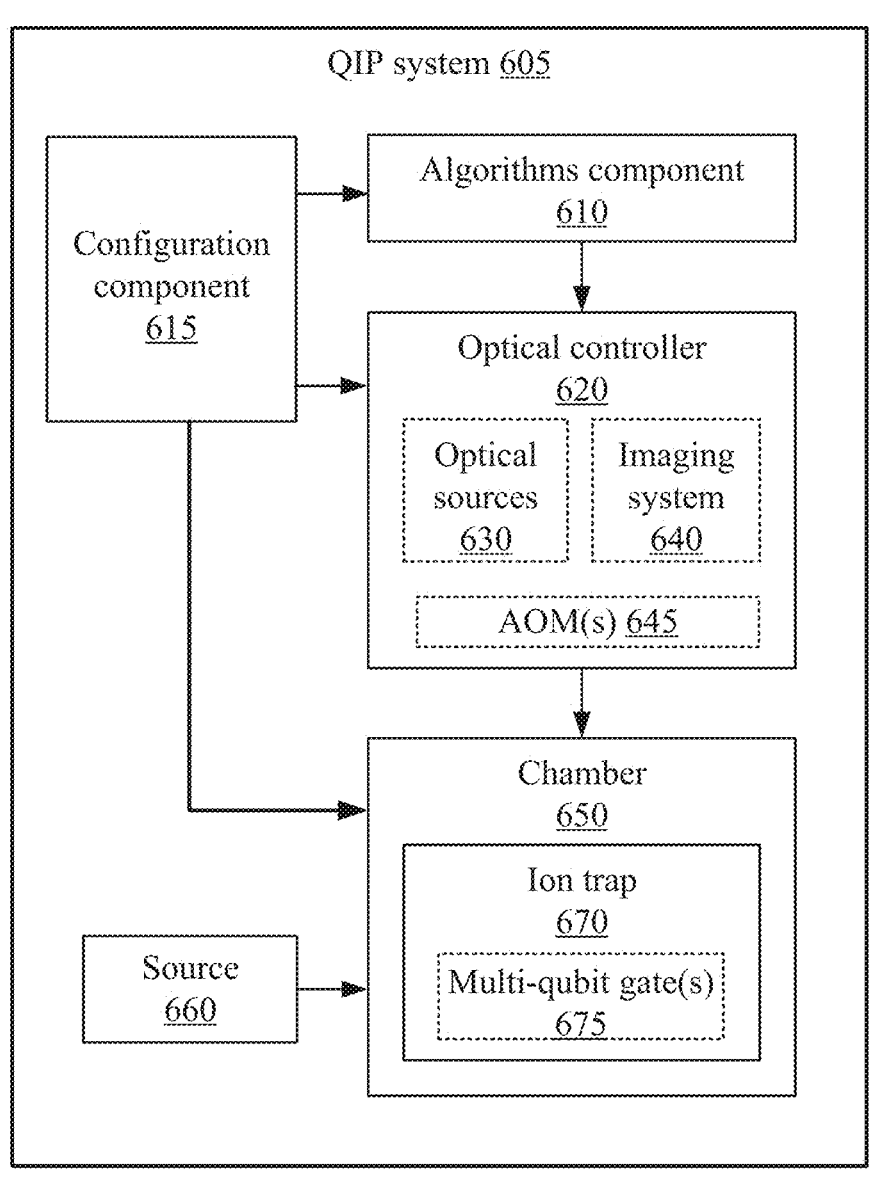
FIG. 6A is a block diagram that illustrates an example of a quantum information processing (QIP) system in accordance with aspects of this disclosure.

FIG. 6A is a block diagram 600 that illustrates an example of a QIP system 605 in accordance with aspects of this disclosure. The QIP system 605 may also be referred to as a quantum computing system, a quantum computer, a computer device, or the like. In an aspect, the QIP system 605 may correspond to portions of a quantum computer implementation of the computing device 400 in FIG. 4.

The QIP system 605 can include a source 660 that provides atomic species (e.g., a flux of neutral atoms) to a chamber 650 having an ion trap 670 that traps the atomic species once ionized (e.g., photoionized) by an optical controller 620. In some implementations, the source 660 is inside the chamber 650. The ion trap 670 may be used to trap ions in a linear crystal (as illustrated in the diagram 200*a* in FIG. 2A). Optical sources 630 in the optical controller 620 may include one or more laser or optical beam sources that can be used for ionization of the atomic species, control (e.g., phase control) of the atomic ions, for fluorescence of the atomic ions that can be monitored and tracked by image processing algorithms operating in an imaging system 640 in the optical controller 620, and/or to perform optical control functions associated with the implementation of multi-qubit gates 675 using a modification of the CZ protocol, as well as other interactions with the multi-qubit gates 675, such as the ones described above. In an aspect, the optical sources 630 may be implemented separately from the optical controller 620.

The imaging system 640 can include a high resolution imager (e.g., CCD camera) for monitoring the atomic ions while they are being provided to the ion trap or after they have been provided to the ion trap 670. In an aspect, the imaging system 640 can be implemented separate from the optical controller 620, however, the use of fluorescence to detect, identify, and label atomic ions using image processing algorithms may need to be coordinated with the optical controller 620.

The acousto-optic modulator(s), AOM(s) 645, may be used to perform modulation of laser or optical beams produced by the optical sources 630. The modulation can include AM, FM, PM, or any combination of the three, and can be used at least in part to counteract or compensate for drifts in mode frequency, as discussed above.

The QIP system 605 may also include an algorithms component 610 that may operate with other parts of the QIP system 605 (not shown) to perform quantum algorithms or quantum operations, including single qubit operations or multi-qubit operations as well as extended quantum computations. As such, the algorithms component 610 may provide instructions to various components of the QIP system 605 (e.g., to the optical controller 620) to enable the implementation of the quantum algorithms or quantum operations, and consequently, implement the various techniques described herein.

The QIP system 605 may also include a configuration component 615 that can provide the appropriate instructions, commands, and/or information to other parts of the QIP system 605 to enable the appropriate motional state and other conditions that are necessary to implement multi-qubit gates using the modified version of the CZ protocol and then use in various algorithms the multi-qubit gates that are implemented in this manner. Accordingly, the configuration component 615 may communicate with the algorithms component 610 to identify which algorithm and which type of multi-qubit gates to be implemented for the algorithm, with the optical controller 620 in connection with the operations to be performed with the modified version of the CZ protocol as well as for optical addressing schemes and for performing techniques to handle mode frequency and/or intensity drifts, and with the chamber 650/ion trap 670 to enable the proper conditions for establishing the motional state and to perform interactions with the motional state. In some implementations, the configuration component 615 need not be a separate component and can be at least partially integrated into other components of the QIP system 605. In some implementations, the configuration component 615 may be implemented as a hardware processor with executable instructions to perform the various functions described above.

Figure 6B:
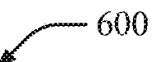
FIG. 6B is a block diagram that illustrates an example of an algorithms component of the QIP system in FIG. 6A in accordance with aspects of this disclosure.

FIG. 6B shows at least a portion of the algorithms component 610. In this example, the algorithms component 610 may include different subcomponents to support the operation of different algorithms. Each of these subcomponents may receive, store, and/or access information associated with performance of a specified algorithm in the QIP system 605, including information associated with the types of multi-qubit gates to be implemented for the performance of the specified algorithm. In an implementation, the algorithms component 610 may include a Grover's algorithm component 611 with information for the performance of the Grover's algorithm as described above. In an implementation, the algorithms component 610 may include a QAOA component 612 with information for the performance of the QAOA as described above. In an implementation, the algorithms component 610 may include a Shor's factoring algorithm component 613 with information for the performance of the Shor's factoring algorithm as described above. In an implementation, the algorithms component 610 may include an error correction component 614 with information for the performance of the error correction codes as described above. In an implementation, the algorithms component 610 may include a n-body interaction quantum dynamics simulations component 615 with information for the performance of quantum simulations as described above. In an implementation, the algorithms component 610 may include a Hamiltonian simulations component 616 with information for the performance of Hamiltonian simulations as described above.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for implementing multi-qubit gates using an ion trap in a quantum information processing (QIP) system, the method comprising:

enabling a low-heating rate motional mode at a ground state of motion with multiple ions in the ion trap, each of the multiple ions having at least two qubit states and an auxiliary state; and implementing a Cirac and Zoller (CZ) gate by performing a CZ protocol using the low-heating rate motional mode as a motional state of the CZ protocol and using the at least two qubit states and the auxiliary state, the CZ gate being a multi-qubit gate having multiple qubits;

wherein the low-heating rate motional mode is one in which the multiple ions in the ion trap are coupled and the low-heating rate motional mode has a spatial frequency profile that is different than a spatial frequency profile of background electric field noise.

2. The method of claim 1, wherein the CZ gate is a multi-control qubit gate.

3. The method of claim 1, wherein the CZ gate is an n-controlled Z gate or $C^n$-Z gate.

4. The method of claim 1, wherein the low-heating rate motional mode is a zig-zag mode.

5. The method of claim 1, wherein the auxiliary state is one of Zeeman states or a meta-stable excited state.

6. The method of claim 1, wherein the CZ gate is an n-controlled NOT (C''-NOT) gate.

7. The method of claim 1, further comprising performing one or more algorithms by the QIP system using the CZ gate.

8. The method of claim 7, wherein the one or more algorithms include a Grover's algorithm, and the method further comprises implementing one or more oracles of the Grover's algorithm using the CZ gate.

9. The method of claim 7, wherein the one or more algorithms include a quantum approximation optimization algorithm (QAOA), and the method further comprises implementing one or more Boolean clause conditions of the QAOA using the CZ gate.

10. The method of claim 7, wherein the one or more algorithms include a Shor's factoring algorithm, and the method further comprises implementing one or more arithmetic circuits of the Shor's factoring algorithm using the CZ gate.

11. The method of claim 7, wherein the one or more algorithms include an error correction algorithm, and the method further comprises implementing distillation circuits of the error correction algorithm using the CZ gate.

12. The method of claim 7, wherein the one or more algorithms include Hamiltonian simulations, and the method further comprises implementing a Select-V gate of the Hamiltonian simulations using the CZ gate.

13. A quantum information processing (QIP) system for implementing multi-qubit gates in an ion trap, comprising:

the ion trap with multiple ions, each of the ions having at least two qubit states and an auxiliary state;

an optical controller configured to control the multiple ions in the ion trap; and a configuration component configured to:

enable a low-heating rate motional mode at a ground state of motion with the multiple ions in the ion trap, and implement a Cirac and Zoller (CZ) gate by performing a CZ protocol using the low-heating rate motional mode as a motional state of the CZ protocol and using the at least two qubit states and the auxiliary state, the CZ gate being a multi-qubit gate having multiple qubits;

wherein the low-heating rate motional mode is one in which the multiple ions in the ion trap are coupled and the low-heating rate motional mode has a spatial frequency profile that is different than a spatial frequency profile of background electric field noise.

14. The QIP system of claim 13, wherein the CZ gate is an n-controlled Z gate or C''-Z gate.

15. The QIP system of claim 13, wherein the low-heating rate motional mode is a zig-zag mode.

16. The QIP system of claim 13, wherein the auxiliary state is one of Zeeman states or a meta-stable excited state.

17. The QIP system of claim 13, further comprising an algorithms component configured to perform one or more algorithms using the CZ gate.

18. The QIP system of claim 17, wherein the algorithms component is configured to perform one or more of:

a Grover's algorithm, and the configuration component is configured to implement one or more oracles of the Grover's algorithm using the CZ gate, a quantum approximation optimization algorithm (QAOA), and the configuration component is configured to implement one or more Boolean clause conditions of the QAOA using the CZ gate, a Shor's factoring algorithm, and the configuration component is configured to implement one or more arithmetic circuits of the Shor's factoring algorithm using the CZ gate, an error correction algorithm, and the configuration component is configured to implement distillation circuits of the error correction algorithm using the CZ gate, a quantum simulation, and the configuration component is configured to execute at least one of multi-body interactions performed as part of the quantum simulation using the CZ gate, or Hamiltonian simulations, and the configuration component is configured to implement a Select-V gate of the Hamiltonian simulations using the CZ gate.

* * * * *